United States Patent [19]

Krishna et al.

[11] 3,872,326

[45] Mar. 18, 1975

[54] BIDIRECTIONAL SEMICONDUCTOR SWITCH WITH IMPROVED DV/DT CAPABILITY

[75] Inventors: Surinder Krishna, Ballston Lake, N.Y.; Paul R. Malmberg, Pittsburgh, Pa.

[73] Assignee: Westinghouse Electric Corporation, Pittsburgh, Pa.

[22] Filed: Jan. 23, 1974

[21] Appl. No.: 435,820

[52] U.S. Cl. ..... 307/252 T, 307/252 N, 323/22 SC, 323/24

[51] Int. Cl. .......... H03k 17/72

[58] Field of Search .......... 307/252 N, 252 T; 333/30 R; 323/22 SC, 24

[56] References Cited

UNITED STATES PATENTS 3,626,309 12/1971 Knowles .......... 307/213 X

*Primary Examiner*—John Zazworsky

*Attorney, Agent, or Firm*—C. L. Menzemer

[57] ABSTRACT

A bidirectional semiconductor switch is provided with improved dV/dt capability by electrically connecting two thyristors in reverse parallel. A blocking circuit comprising at least one acoustic surface wave device is provided for electrically isolating the thyristors from each other and from a control circuit producing the control or gating signals for the thyristors. Electrical means such as ohmic leads enable the control signals outputted from the surface wave device to be separately fed to gate the thyristors. Preferably, a single acoustic surface wave device is utilized having a transmitter transducer positioned intermediate of two receiver transducers and capable of transmitting an acoustic surface wave in opposite directions through an insulator base member to the receiver transducers.

3 Claims, 5 Drawing Figures

BIDIRECTIONAL SEMICONDUCTOR SWITCH WITH IMPROVED DV/DT CAPABILITY

FIELD OF THE INVENTION

The present invention relates to semiconductor devices and particularly bidirectional semiconductor switches.

BACKGROUND OF THE INVENTION

A bidirectional or AC switch is a switch that can conduct in both directions. Semiconductor bidirectional switches are typically provided by a triac or two thyristors circuited in reverse parallel. A triac is a multilayer structure which is the equivalent of two reverse-parallel thyristors in a single semiconductor body. This requires judicious arrangement of the electrodes relative to the various P and N regions, see Ankrum, *Semiconductor Electronics*, pp. 531–32 (1971).

Triacs are limited to low frequency and low power applications by reason of the common base regions of the equivalent thyristors. These regions must be in a conduction mode on one-half of the cycle, and a blocking mode on the other half of the cycle. As a result, the operating temperatures of the junctions in steady state are high, which limits the power capacity of the device, and the base regions must be discharged and recharged during each cycle, which limits the dV/dt capacity and high frequency capacity of the device.

To attain higher dV/dt capability, e.g. for inductive loads, two separate thyristors can be provided in reverse parallel, with separate RC networks to control dV/dt of each thyristor. However, this circuit still does not provide a bidirectional switch with the dV/dt capability of each thyristor circuited singularly. When two thyristors, whether in separate or the same semiconductor body, are connected in reverse parallel, difficulty is encountered in applying a common control or switching signal to the base regions of both thyristors. The gate electrodes must be electrically isolated, by rectifier or other blocking circuits, so that the applied AC signal does not avoid the blocking capability of the thyristor by routing through the control circuit. The blocking circuit, however, attenuates the control signal and in turn limits the dV/dt capability of the bidirectional device. And the attenuation of the control signal by the device necessarily increases as the needed blocking voltage increases.

The present invention overcomes these difficulties and problems. It provides a bidirectional switch with excellent static and dynamic (dV/dt) capability, while providing good electrical isolation of the control circuit. Further, both low power loss and high voltage isolation are obtained with bidirectional switch of the present invention.

SUMMARY OF THE INVENTION

A bidirectional or AC switch is provided with improved dV/dt by electrically connecting two thyristors in reverse parallel. Generally, the thyristors are disposed in the same semiconductor body, or separate semiconductor bodies each having first and second major surfaces. Note that the bodies may be either wholly semiconductor material or an epitaxial or single crystal semiconductor layer on an insulating substrate. In any embodiment, each thyristor has four active impurity regions of alternate carrier-type in semiconductor body or layer, with PN junctions formed between each two adjacent impurity regions. The two intermediate impurity regions are base regions and more specifically cathode-base and anode-base regions; and the two extremity impurity regions are emitter regions and more specifically cathode-emitter and cathode-base regions. The thyristors may be vertically or laterally disposed through one or more semiconductor bodies or layers. To provide electrical contact to the active impurity regions of the thyristor, each thyristor has spaced apart metal electrical contacts disposed on the major surfaces of the semiconductor body or bodies. The metal contacts make ohmic contact to both emitter regions as well as at least one base region of each thyristor.

The bidirectional switch also includes a blocking circuit comprised of at least one acoustic surface wave device. Generally, each surface wave device comprising (1) a base member capable of propagating an acoustic surface wave and electrically insulating electrical input signals from electrical output signals, (2) at least one transmitter transducer having a grid with interdigital fingers supported on said base and adapted to receive an electrical control signal and generate an acoustic surface wave in said base member in response to said electrical control signal, and (3) at least one receiver transducer having a grid with interdigital fingers supported on said base and adapted to receive an acoustic surface wave transmitted in said base member by a transmitter transducer and produce an electrical output signal in response to said acoustic surface wave. Further, the bidirectional semiconductor switch has electrical means to separately conduct control signals from the surface wave device or devices to the thyristors.

In operation, the blocking circuit electrically blocks or isolates the gating connections of the two thyristors from each other and also electrically blocks or isolates the thyristors from a control circuit generating control signals for gating the thyristors. Specifically, a control signal, which may be either digital or analog, for switching the thyristors is fed from a control circuit to an acoustic surface wave device or devices where the signal is transduced and transmitted through the device (s) as surface waves or amplitude modulations of surface waves. The control signals are retransduced from surface waves or amplitude modulations thereof to separate electrical signals which are separately connected to the thyristors.

A separate acoustic surface wave device may be utilized to separately block the gate or control signal to each thyristor. Preferably, however, only one acoustic surface wave device is provided for the blocking of both thyristors. The surface wave device has one transmitter transducer positioned intermediate of two receiver transducers so that the one transmitter transducer may simultaneously transmit acoustic surface waves through the device in both directions from the transmitter transducer to the separate receiver transducers. The control signal is thus simultaneously blocked and transmitted to the thyristors with a minimum of power loss and an optimum dV/dt capability.

Other details, objects and advantages of the invention will become apparent as the following description of the presently preferred embodiments thereof proceeds.

BRIEF DESCRIPTION OF THE DRAWINGS

In the accompanying drawings the present preferred embodiments and present preferred methods of performing the invention are illustrated, in which.

DESCRIPTION OF THE PREFERRED EMBODIMENTS

Figures 1, 2, 3:
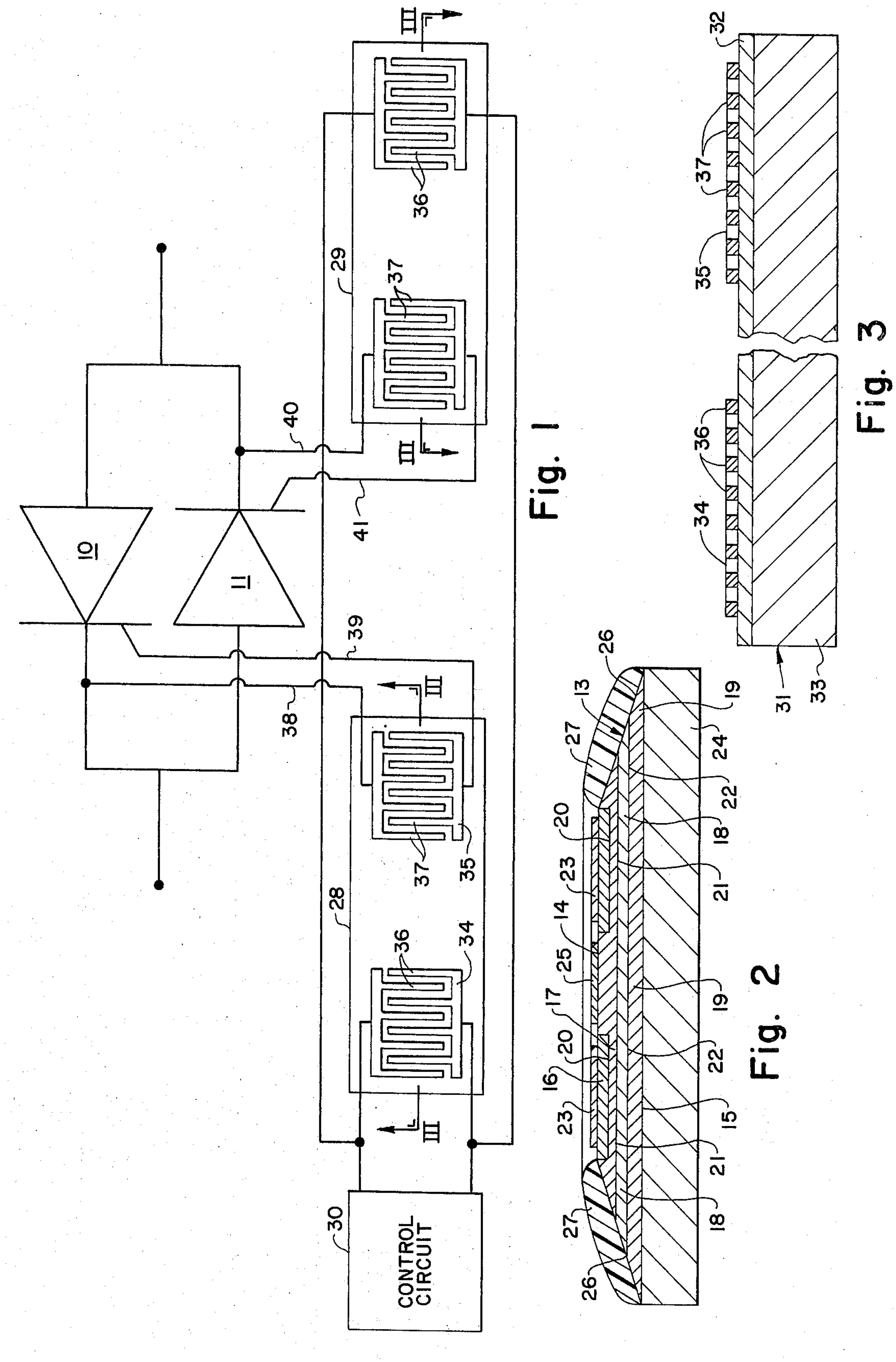
FIG. 1 is a schematic of an electrical circuit embodying a bidirectional semiconductor switch of the present invention.
FIG. 2 is a cross-sectional view of a conventional thyristor utilized in the bidirectional semiconductor switch shown in FIG. 1.
FIG. 3 is a cross-sectional view taken along line III—III of FIG. 1 of each acoustic surface wave device shown in FIG. 1.

Referring to FIGS. 1 to 3, an electrical circuit is shown embodying a bidirectional semiconductor switch of the present invention. The bidirectional switch comprises two thyristors 10 and 11 electrically connected in reverse parallel as shown in FIG. 1.

Thyristors 10 and 11 typically have substantially the same electrical characteristics and have conventional structure. FIG. 2 shows a standard center-fired thyristor suitable for use as thyristors 10 and 11. Specifically, each thyristor comprises a semiconductor body 13 such as a single crystal silicon wafer, having first and second opposed major surfaces 14 and 15 and four layers or impurity regions 16, 17, 18 and 19 therethrough. The impurity regions are of alternate carrier-type, as shown, with PN junctions 20, 21 and 22 formed between adjacent regions 16 and 17, regions 17 and 18, and regions 18 and 19, respectively. The two intermediate impurity regions 17 and 18 are base regions and specifically cathode-base and anode-base regions, respectively; and the two extremity impurity regions 16 and 19 are emitter regions and specifically cathode-emitter and anode-emitter regions, respectively.

To provide electrical connections for each thyristor, metal contacts 23, 24 and 25 are spaced apart on major surfaces 14 and 15 of semiconductor body 10. The contacts 23, 24 and 25 make separate ohmic contacts to the two emitter regions 16 and 19 and the base region 17, respectively. Each thyristor is usually completed by bevelling side surfaces 26 of semiconductor body 13 to shape the electric fields formed within the body during operation, and coating the bevelled surfaces 26 with a suitable passivating resin 27 such as a silicone or epoxy composition.

It should be noted in this connection that, while FIG. 2 shows an example of a conventional thyristor structure, a wide variety of other thyristor designs can be employed in the present invention. For example, the thyristors may be edge-fired, or may be in lateral configurations wherein the four active impurity regions adjoin one major surface of the semiconductor body, see e.g., U.S. Pat. No. 3,699,406, issued Oct. 17, 1972.

The bidirectional switch of the present invention also comprises electrical blocking or isolation circuits 28 and 29, which consist of separate acoustic surface wave devices. The surface wave devices simultaneously receive a control signal from control circuit 30 suitable for switching the thyristors 10 and 11 as well as suitable for transmission through the surface wave devices 28 and 29. If the control signal for switching of the thyristors is not also suitable for transmission through the surface wave devices, the control signals are preferably telemetered through the acoustic surface wave devices as amplitude modulations of carrier signals suitable for transmission through the surface wave devices, as fully described in application Ser. No. 435,815, filed Jan. 23, 1974 and assigned to the same assignee as the present invention.

For simplicity of description, it shall be here assumed that the control signal for switching the thyristors 10 and 11 is also suitable for transmission through the acoustic surface wave devices. In this connection, the details of typical acoustic surface wave devices used for the electrical blocking circuits 28 and 29 are shown in FIG. 3, which are typically at low DC or average potential relative to ground.

Each acoustic surface wave device 28 and 29 comprises an insulator base member 31 capable of propagating a surface wave, while electrically insulating electrical input signals from electrical output signals. The base member may be a thin substrate, e.g. 10 to 100 mils thick, of piezoelectric material such as quartz or lithium niobate ($LiNbO_3$), having good electrical insulator properties. Preferably, however, the base member comprises a piezoelectric layer 32 such as lithium niobate ($LiNbO_3$), bismuth germanate ($Bi_{12}GeO_{20}$), silicon dioxide ($SiO_2$), gallium arsenide (GaAs), zinc oxide (ZnO), zinc sulfide (ZnS), cadmium sulfide (CdS), or lead zirconate titanate (PZT), which also provides electrical insulating properties. The piezoelectric layer is formed as a thin film on an insulator substrate 33 such as quartz glass, spinel ($MgOxAl_2O_3$) or sapphire ($Al_2O_3$). Typically, the substrate 33 is about 10 to 100 mils in thickness, and the thin film layer 32 of piezoelectric material is 0.5 to 50 microns in thickness, depending upon the wavelength of the control signal to be transmitted. Generally, the thickness of the piezoelectric layer 32 is about 2 wavelengths of the control signal to be transmitted. The piezoelectric material 32 is preferably deposited on substrate 33 by a suitable known evaporation or RF sputtering technique.

Alternatively, the base member may contain no piezoelectric material except for very thin layers in the areas where the tranducers are formed. That is, the acoustic surface waves are transmitted through insulator material other than piezoelectric material. In this alternative, it is important that the thickness of the piezoelectric layers of the transducers be on the order of one-half wave amplitude or less (e.g. 1 micron) to provide good surface wave transmission from the transmitter transducer through the base member, and from the base member to the receiver transducer.

In still other embodiments, there may be intermediate epitaxial or single crystal semiconductor layer(s) and insulator layer(s) sandwiched between the piezoelectric layer 32 and the substrate 33. This embodiment of base member 31 is particularly useful in providing the invention integral with an integrated circuit because the integrated circuit can be fabricated in and on the semiconductor layers under and around the surface wave devices 28 and 29 and thyristors 10 and 11. In this embodiment, only the piezoelectric layer and underlying insulator layer need to be electrically insulating to provide the requisite electrical isolation for the bidirectional switch.

In any embodiment, transmitter grid 34 and receiver grid 35 are positioned on piezoelectric layer 32 of base member 31 to provide transmitter and receiver transducers for each acoustic surface wave device 28 and 29, respectively. Preferably, grids 34 and 35 are simultaneously deposited by vapor or sputter deposition of a metal such as gold or aluminum through a photoresist mask or a metallic mask. Grids 34 and 35 each have interdigital fingers, with alternate fingers attached to opposite electrodes of the grid.

The width of and spacing between the interdigital fingers 36 and 37 of grids 34 and 35, respectively, are highly critical. Fingers 36 and 37 of a given width and spacing will transmit or receive only signals in a very select frequency range, rejecting all others. Thus, the fingers of both grids are of substantially equal width, and substantially equally spaced substantially parallel to each other. Typically, the center-to-center spacing of the fingers 36 and 37 is 0.25 to 25 microns, with the width and spacing of the fingers being equal. That is, both the width and the spacing between the fingers are between about 0.12 and 12.5 microns.

Also, the distance between the grids 34 and 35 is critical. Most desirably, the grids are spaced sufficiently apart to provide the necessary voltage isolation for the bidirectional switch, yet not be any further apart to avoid unnecessary attenuation and power loss of the control signals while in acoustic surface wave form. Typically, the grids will be about 1 millimeter apart per 1 kilovolt to be switched by the control signal.

By this arrangement, the grids 34 of transmitter transducers of acoustic surface wave devices 28 and 29 are adapted to simultaneously receive a control or switching signal from control circuit 30 and transduce and generate acoustic surface waves in base members 31 of said surface wave devices in response to said electrical control signal. Further, the receiver grids 35 of the receiver transducers are adapted to receive the acoustic surface waves transmitted in base members 31 by transmitter grid 34 and in turn produce electrical switching signals in response thereto.

The bidirectional switch of the present invention is completed by electrical means for separately transmitting the electrical output signal from the acoustic surface wave devices 28 and 29 to the thyristors 10 and 11 so that the control signal can gate the thyristors. Specifically, the electrical means comprise electrical leads 38, 39, 40 and 41. Leads 38 and 39 electrically connect the electrodes of receiver grid 35 of surface wave device 28 ohmically to the cathode-emitter and cathode-base contacts 23 and 25 of thyristor 10, respectively. Similarly, leads 40 and 41 electrically connect the electrodes of receiver grid 35 of surface wave device 29 ohmically to the cathode-emitter and cathode-base contacts 23 and 25 of thyristor 11, respectively.

The resulting AC or bidirectional switch has very high dV/dt capability because of the relatively low signal attenuation and power loss through the blocking circuit. Signal attenuation is typically greatest at the surface wave devices, and can be as small as 10db overall. Further, signal attenuation per centimeter of path length between transmitter and receiver transducers can be as small as a fraction of 1db. Power losses can be optimized for a given design blocking voltage simply by the spacing between the transmitter and receiver grids of the acoustic wave devices. In turn, dV/dt capacity for a given blocking voltage is substantially improved over previously available bidirectional switches. Further, the bidirectional switch of the present invention is particularly useful in connection with integrated circuits; the entire circuit can be formed simultaneously and integrally with the integrated circuit requiring only a small surface area of the semiconductor chip and conventional lithographic and thin-film fabrication techniques standard in making integrated circuits.

Figure 4:
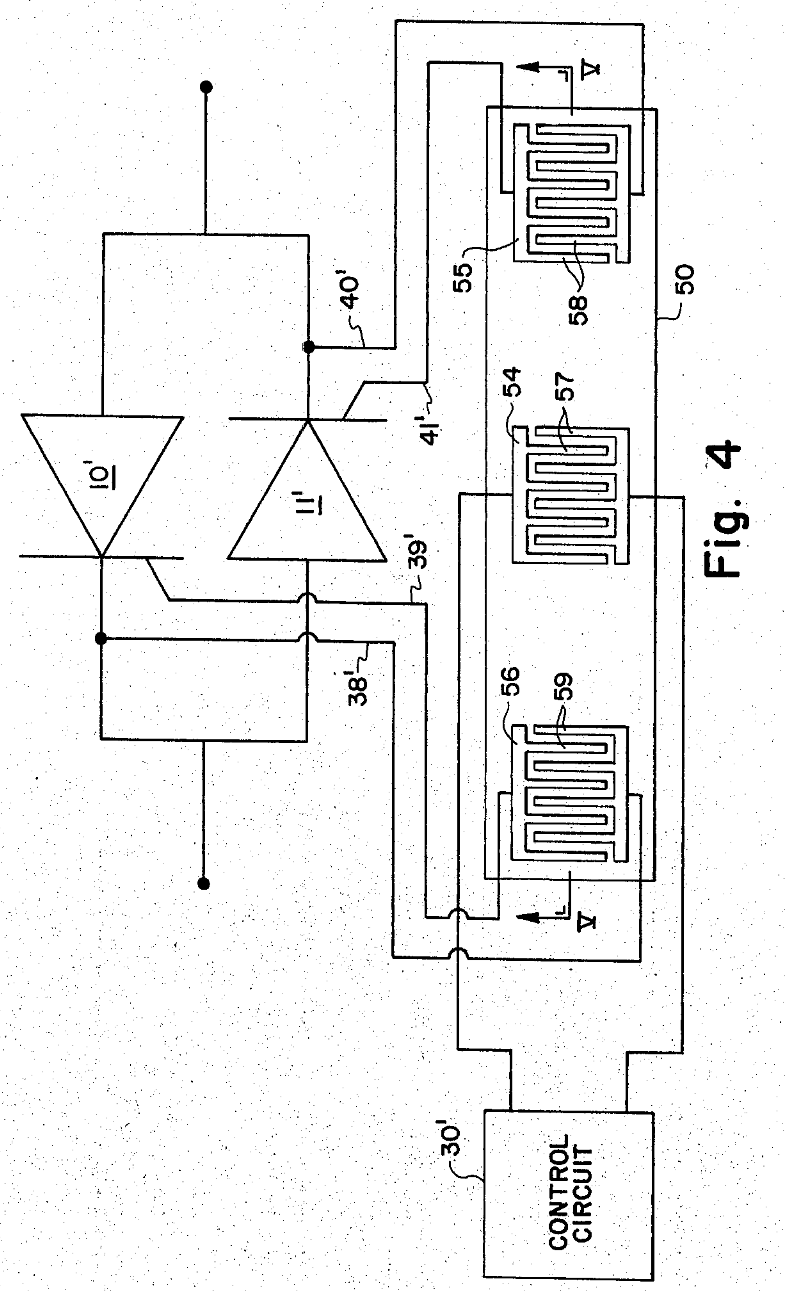
FIG. 4 is a schematic of an electrical circuit embodying an alternative bidirectional semiconductor switch of the present invention.
Figure 5:
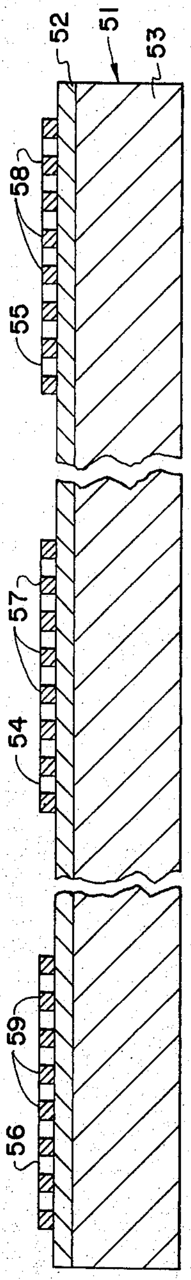
FIG. 5 is a cross-sectional view taken along line V—V of FIG. 4 of the acoustic surface wave device.

Referring to FIGS. 4 and 5, an alternative embodiment of the bidirectional semiconductor switch of the present invention is shown. The bidirectional switch is the same as that described in connection to FIGS. 1 through 3 except for the acoustic surface wave device used for the blocking circuit. A singular novel acoustic surface wave device is provided for the blocking circuit for both thyristors. In this embodiment, the total power loss and total signal attenuation of the blocking circuit through which the thyristors are fired is the same as the power loss and signal attenuation of only one acoustic surface wave device because of the bidirectional transmission with the surface wave device. As a result, the bidirectional switch of this embodiment has even higher dV/dt capability.

Specifically, in this embodiment the electrical blocking or isolation circuits for both thyristors 10' and 11' consists of one acoustic surface wave device 50. The device 50 usually receives control signals from control circuit 30' of select frequency suitable for transmission through the device. However, again, it should be noted that if the control signals needed to fire the thyristors are not suitable for transmission through the signal wave device, the control signals may be telemetered through the surface wave device by amplitude modulation of a carrier signal of select frequency suitable for transmission through the surface wave device, as fully described in application Ser. No. 435,815, filed Jan. 23, 1974 and assigned to the same assignee as the present invention.

Surface wave device 50, which is usually at a low DC or average potential relative to ground, comprises an insulator base member 51 capable of propagating a surface wave, while electrically insulating electrical input signals from electrical output signals. As with surface wave devices 28 and 29, the base member may be a thin substrate, e.g. 10 to 100 mils thick, of suitable piezoelectric material such as quartz or lithium niobate ($LiNbO_3$), having good electrical insulator properties. Preferably, the base member again comprises a piezoelectric layer 52 such as lithium niobate ($LiNbO_3$), bismuth germanate ($Bi_{12}GeO_{20}$), silicon dioxide ($SiO_2$), gallium arsenide (GaAs), zinc oxide (ZNO), zinc sulfide (ZnS), cadmium sulfide (CdS), or lead zirconate titanate (PZT), which also provide the electrical insulating properties. The piezoelectric layer is formed as a thin film on an insulator substrate 53 such as quartz, glass, spinel ($MgOxAl_2O_3$) or sapphire ($Al_2O_3$). Typically, the substrate 53 is about 10 to 100 mils in thickness, and the thin film layer 16 of piezoelectric material is 0.5 to 50 microns in thickness, depending upon the wavelength of the surface wave to be transmitted. Generally, the thickness of the piezoelectric layer 52 is about 2 wavelengths of the surface wave to be transmitted. The piezoelectric material 52 is preferably deposited on substrate 53 by a suitable known evaporation or RF sputtering technique.

Alternatively, the base member may contain no piezoelectric material except for very thin layers in the areas where the transducers are formed. The acoustic surface waves are thus transmitted through insulator material other than piezoelectric material. In this alternative, it is important that the thickness of the piezoelectric layers of transducers be on the order of ½ wave amplitude or less (e.g. 1 micron) to provide good surface wave transmission from the transmitter transducer through the base member, and from the base member to the receiver transducer.

In still other embodiments, there may be intermediate epitaxial or single crystal semiconductor layer(s) and insulator layer(s) sandwiched between the piezoelectric layer 52 and the substrate 53. This embodiment of base member 51 is particularly useful in providing the invention integral with an integrated circuit because the integrated circuit can be fabricated in and on the semiconductor layers under and around the surface wave device 50. Again, in this embodiment, only the piezoelectric layer and underlying insulator layer need to be electrically insulating to provide the requisite electrical isolation for the bidirectional switch.

In any embodiment, acoustic surface wave device 50 has transmitter grid 54 and receiver grids 55 and 56 positioned on piezoelectric layer 52 of base member 51, with the transmitter grid 54 intermediate of the receiver grids 55 and 56. The transmitter grid 54 in conjunction with the underlying piezoelectric layer thus form a transmitter transducer; and the receiver grids 55 and 56 in conjunction with the underlying piezoelectric layer thus form receiver transducers. Preferably, grids 54, 55 and 56 are simultaneously deposited by vapor or sputter deposition of a metal such as gold or aluminum through a photoresist mask or a metallic mask. Grids 54, 55 and 56 each have interdigital fingers 57, 58 and 59, respectively, with alternate fingers attached to opposite electrodes of the grid.

The width of and spacing between the interdigital fingers 57, 58 and 59 of grids 54, 55 and 56, respectively, are highly critical. Fingers of a given width and spacing will transmit or receive only signals in a very select frequency range, rejecting all others. Thus, the fingers of all grids are of substantially equal width, and substantially equally spaced substantially parallel to each other. Typically, the center-to-center spacing of the fingers 57, 58 and 59 is 0.25 to 25 microns, with the width and spacing of the fingers being equal. That is, both the width and spacing between the fingers are between about 0.12 to 12.5 microns.

Also, the distances between the grids 54, 55 and 56 is critical. Most desirably, the grids are equally spaced sufficiently apart to provide the necessary voltage isolation for the apparatus, yet not be any further apart to avoid unnecessary attenuation and power loss of the control signal while in the acoustic surface wave mode. Typically, the grids will be about 1 millimeter apart per 1 kilovolt to be the necessary blocking for the bidirectional switch.

By this arrangement, the transmitter grid 54 is adapted to receive an electrical control signal from control circuit 30′ and generate an acoustic surface wave in base member 51 in opposite directions in response to said electrical signal. Further, the receiver grids 55 and 56 are adapted to receive the acoustic surface wave transmitted in base member 51 by transmitter grid 54 and in turn produce an electrical output signal in response thereto. The output electrical signals from grids 55 and 56 are then separately conducted by electrical means 38′, 39′, 40′ and 41′ to thyristors 10′ and 11′ as previously described in connection with FIGS. 1 through 3. As a result, the common transmitter transducer 54 has transmitted as acoustic surface wave to both receiver transducers, separately blocking the thyristors from each other and from the control circuit with a minimum of energy loss. The bidirectional switch in turn attains an optimum in dV/dt capability.

While present preferred embodiments of the invention have been shown and described with particularity, it is distinctly understood that the invention may be otherwise variously performed within the scope of the following claims. Specifically, a great variety of acoustic surface wave device designs can be used in the present invention; and operation of the surface wave devices over a wide choice of frequencies is possible in the present invention. Further, the surface wave devices may be arranged in series or parallel to match power and impedance needs of the control circuit and the thyristors.

What is claimed is:

1. A bidirectional semiconductor switch comprising:

A. two thyristors electrically connected in reverse parallel and disposed in at least one semiconductor body having first and second opposed major surfaces, (1) each said thyristor having four impurity regions of alternate carrier-type disposed alternately with a PN junction formed between adjacent regions, the two impurity regions intermediate being base regions and the two extremity impurity regions being emitter regions, and (2) metal electrical contacts spaced apart on the major surfaces of said semiconductor body and making separate ohmic contact with the two emitter regions and at least one base region of each thyristor;

B. a blocking circuit comprising at least one acoustic surface wave device for electrically isolating the thyristors from each other and from a control circuit generating control signals for the thyristors, each surface wave device comprising (1) a base member capable of propagating a surface wave and electrically insulating electrical input signals from electrical output signals, (2) at least one transmitter transducer having a grid with interdigital fingers supported on said base member and adapted to receive an electrical control signal and generate an acoustic surface wave in said base member in response to said electrical control signal, and (3) at least one receiver transducer having a grid with interdigital fingers deposited on said base member and adapted to receive an acoustic surface wave transmitted in said base member by a transmitter transducer and produce an electrical output signal in response to said acoustic surface wave; and C. electrical means for separately conducting control signals from said surface wave device to the metal contacts connected to emitter and base regions of each thyristor.

2. A bidirectional solid state switch as set forth in claim 1 wherein:

the blocking circuit comprises two acoustic surface wave devices, one for each thyristor.

3. A bidirectional solid state switch as set forth in claim 1 wherein:

the blocking circuit comprises one acoustic surface wave device, said device having one transmitter transducer positioned on said base member between two oppositely positioned receiver transducers, said transmitter transducer capable of simultaneously transmitting an acoustic surface wave in opposite directions to the receiver transducers.

* * * * *